(12) United States Patent
Nakayama et al.

(10) Patent No.: US 6,518,656 B1
(45) Date of Patent: Feb. 11, 2003

(54) REDUCED THICKNESS OPTICAL IMAGE PICKUP DEVICE WITH IMPROVED SEALING AND METHOD OF MAKING SAME

(75) Inventors: Yoshinori Nakayama, Chiba (JP); Hirokazu Nakayoshi, Kanagawa (JP)

(73) Assignee: Sony Corporation (JP)

( * ) Notice: Subject to any disclaimer, the term of this patent is extended or adjusted under 35 U.S.C. 154(b) by 75 days.

(21) Appl. No.: 09/689,753

(22) Filed: Oct. 13, 2000

(30) Foreign Application Priority Data

Oct. 19, 1999 (JP) ............................. 11-296496

(51) Int. Cl.[7] .................. H04N 5/225; G02B 7/00; G09G 3/32; H01L 23/22; H01L 23/02
(52) U.S. Cl. .................. 257/680; 257/774; 257/725; 257/431; 257/432; 257/433; 257/434; 257/435; 257/436; 257/80; 257/99; 257/100; 257/240; 257/291; 257/294; 257/81; 257/82; 257/83; 257/84; 348/340; 348/335; 355/53
(58) Field of Search ................. 257/680, 774, 257/725, 668, 80–84, 99, 100, 290, 291, 294, 431–436; 348/340, 335; 355/53

(56) References Cited

U.S. PATENT DOCUMENTS 4,560,273 A * 12/1985 Ando et al. ................ 356/237
5,153,734 A * 10/1992 Kanamori et al. .......... 358/225
5,609,561 A * 3/1997 Uehara et al. .............. 600/112
5,673,083 A * 9/1997 Izumi et al. ................ 348/340
5,699,073 A * 12/1997 Lebby et al. ................. 257/99
6,025,873 A * 2/2000 Nishioka et al. ............. 348/72
6,072,232 A * 6/2000 Li et al. ...................... 257/680
6,084,238 A * 7/2000 Todokoro et al. ........... 250/310
6,203,222 B1 * 3/2001 Wakabayashi et al. ... 400/118.3
6,326,602 B1 * 12/2001 Tabata ...................... 250/208.1
2001/0012098 A1 * 8/2001 Mishima ...................... 355/53

* cited by examiner

Primary Examiner—Alexander O. Williams
(74) Attorney, Agent, or Firm—Rader, Fishman & Grauer PLLC; Ronald P. Kananen, Esq.

(57) ABSTRACT

An image pickup device is provided with a reduced profile. There is provided a circuit board that is formed with a predetermined circuit pattern having bonding portions and which has a through hole, a pickup element that has a light-receiving portion and bonded portions and which is secured to one surface of the circuit board by bonding the bonded portions to the bonding portions of the circuit pattern, and a cover body which has a lens portion for guiding incident light to the light-receiving portion of the pickup element through the through hole of the circuit board and that is secured to another surface of the circuit board opposite to the above-mentioned surface such that the through hole is covered.

10 Claims, 9 Drawing Sheets

REDUCED THICKNESS OPTICAL IMAGE PICKUP DEVICE WITH IMPROVED SEALING AND METHOD OF MAKING SAME

BACKGROUND OF THE INVENTION

1. Field of the Invention

The present invention relates to the technical field of image pickup devices and methods of manufacturing the same. More particularly, the invention relates to the technical field of image pickup devices in which light incident upon a lens portion is guided to a light-receiving portion and is subjected to photo electric conversion and methods of manufacturing the same.

2. Description of the Related Art

Pickup apparatuses, such as video cameras, are normally equipped with an image pickup device having a CCD (charge coupled device), CMOS (complimentary metal oxide semiconductor) or the like as a light-receiving portion.

FIG. 1 shows an example of such a conventional pickup device.

An image pickup device "a" is formed by mounting a main body c, having a cover body b attached thereto, on a circuit board d.

The cover body b has a substantially cylindrical configuration, and a lens e is held at one end of the cover body b.

For example, the main body c is formed by providing required members on a molded body f formed from a resin material. The molded body f has a mounting recess g formed on one surface thereof, and a through hole h is formed in the middle of the bottom of the mounting recess g. A bonding portion i in the form of a recess is formed in the middle of the bottom of the through hole h of the molded body f.

A lead frame j is provided on the molded body f using insert molding. A part of the lead frame j is embedded in the molded body f, and the rest of the same is located outside the molded body f.

A CCD image sensor 1, as a light-receiving portion, is secured to the bonding portion i of the molded body f with an adhesive k; and, the CCD image sensor 1 is connected to one end of the lead frame j through wires m, m, . . . .

A transparent lid body o is mounted to the mounting recess g of the molded body f with an adhesive n to keep a space p, defined in the molded body f, hermetic.

The cover body b is mounted to cover the lid body o that is mounted on the molded body f. The other end of the lead frame j of the main body portion c is bonded to bonding portions q, q, . . . of the circuit board d.

Since the molded body f is provided and the bonding portion i in the form of a recess is provided on the molded body f to provide the CCD image sensor 1, the above-described conventional pickup device a as a whole has a great thickness, which results in the problem that efforts to obtain a lower profile are hindered.

Japanese Patent Laid-Open No. 84278/1996 disclosed a solid-state pickup apparatus in which a solid-state image sensor is bonded in a face-to-face relationship with a through hole in a board using the flip-chip method. However, no proposal was made on how to prevent sealing resin from flowing into the through hole during resin-sealing of the circuit board and the pickup element.

SUMMARY OF THE INVENTION

The first object of the invention is to solve the above-described problems and to reduce the thickness of an image pickup device.

Another object of the invention is to provide an image pickup device in which sealing resin is prevented from flowing into a through hole during resin-sealing of the circuit board and pickup element.

In order to solve the above-described problems, the image pickup device according to an embodiment of the invention is characterized in that it is equipped with a circuit board that is formed with a predetermined circuit pattern having a bonding portion and which has a through hole, a pickup element which has a light-receiving portion and a bonded portion and that is bonded to the bonding portion of the circuit pattern at the bonded portion to be secured to one surface of the circuit board, a cover body which has a lens portion for guiding incident light to the light-receiving portion of the pickup element through the through hole of the circuit board and that is secured to another surface of the circuit board opposite to the above-mentioned surface such that the through hole is covered and the circumferential surface of the through hole of the circuit board is plated.

A method of manufacturing the image pickup device according to the invention is characterized in that it has the steps of forming a circuit board by forming a predetermined circuit pattern having a bonding portion and a through hole on a board, bonding a bonded portion of a pickup element having a light-receiving portion and the bonded portion to the bonding portion of the circuit board to secure the pickup element on one surface of the circuit board, securing a cover body having a lens portion for guiding incident light to the light-receiving portion of the pickup element through the through hole on another surface of the circuit board opposite to the above-mentioned surface such that the through hole is covered and plating an inner circumferential surface of the through hole of the circuit board.

Therefore, the image pickup device and the method of manufacturing the same according to the present invention make it possible to achieve a low profile and to prevent the flow of sealing resin, because there is no need for using a molded body having a recess for providing the light-receiving portion.

DETAILED DESCRIPTION OF THE DRAWINGS

DETAILED DESCRIPTION OF THE PREFERRED EMBODIMENT

Figure 1:
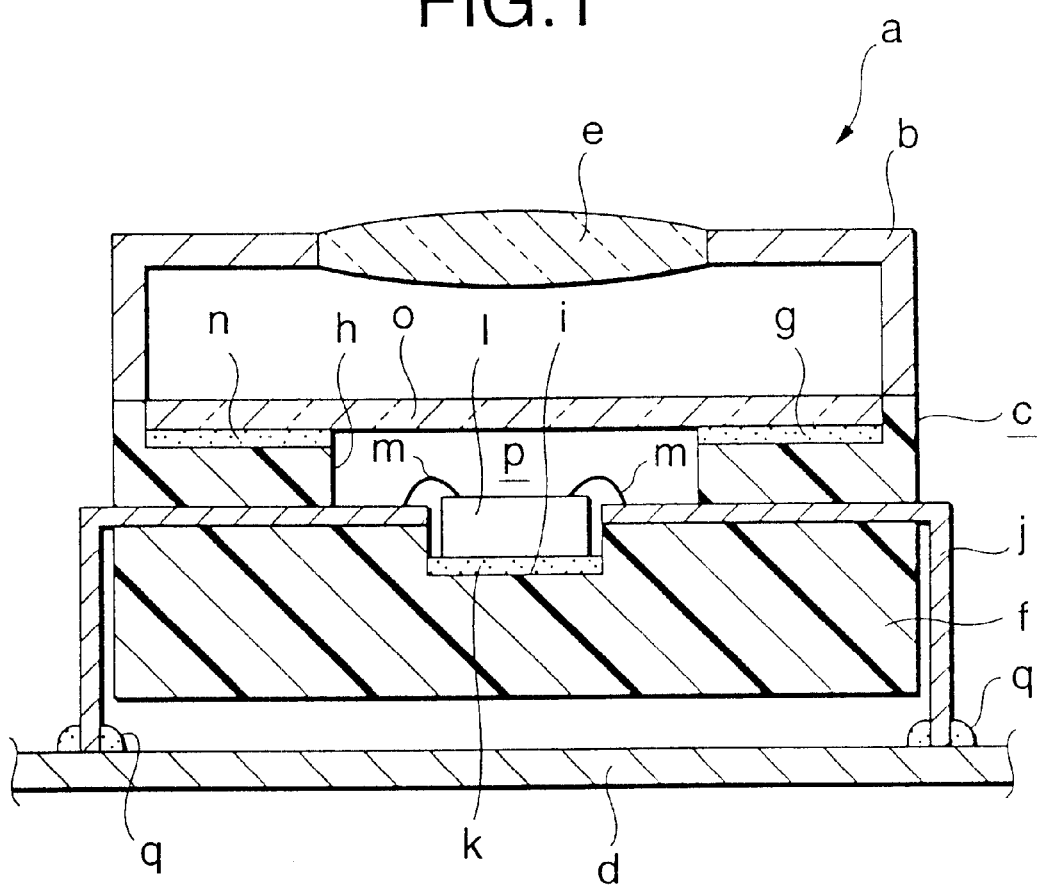
FIG. 1 is a sectional view of a conventional image pickup device.

A description will now be made with reference to the accompanying drawings on an embodiment of an image pickup device according to the invention and a method of manufacturing the same.

The embodiment described below is an application of the invention to an image pickup device having a CCD image sensor as a light-receiving portion and a method of manufacturing the same.

First a configuration of the image pickup device will be described (see FIG. 11). For example, the image pickup device is provided in a pickup apparatus, such as a video camera.

An image pickup device 1 has a circuit board 2, a pickup element 3 that is bonded to one surface (first surface) 2a of the circuit board 2 and a cover body 4 that is mounted on another surface (second surface) 2b of the circuit board 2 opposite to the above surface of the circuit board.

A predetermined circuit pattern is formed on the circuit board 2, and pads 5, 5, . . . , as bonding portions, are formed in a part of the circuit pattern. A through hole 6 is formed in the middle of the circuit board 2.

Plated regions 7, 8 and 9 are respectively provided on a circumferential surface of the through hole 6, the edge of the opening on the side of the first surface 2a and the edge of the opening on the side of the second surface 2b. The plated regions 7, 8 and 9 are continuously formed. Therefore, the plated regions 7, 8 and 9 are formed such that they have a U-shaped longitudinal section as a whole.

The pickup element 3 is formed by providing a CCD image sensor 11 and bumps 12, 12, . . . on a base plate 10. The CCD image sensor 11 is provided in the middle of the base plate 10 and serves as a light-receiving portion. The bumps 12, 12, . . . are provided on outer edges of the base plate 10 and are electrically connected to the CCD image sensor 11. The bumps 12, 12, . . . serve as bonded portions that are respectively bonded to the pads 5, 5, . . . on the circuit board 2.

The pickup element 3 is secured to the circuit board 2 by bonding the bumps 12, 12, . . . to the pads 5, 5, . . . . With the pickup element 3 secured to the circuit board 2 in such a manner, the CCD image sensor 11 is located in a position associated with the through hole 6 of the circuit board 2. With the pickup element 3 secured to the circuit board 2, the gap between the circuit board 2 and pickup element 3 is sealed with sealing resin 13. For example, the sealing resin 13 is thermosetting resin which seals the gap between the circuit board 2 and pickup element 3, such that it entirely covers the pickup element 3.

The use of the sealing resin 13 makes it possible to prevent dust from entering through the gap between the circuit board 2 and pickup element 3, to prevent unnecessary light from entering through the gap between the circuit board 2 and pickup element 3 and to improve the reliability of the bonding between the circuit board 2 and pickup element 3.

The cover body 4 has a substantially cylindrical configuration; and the lens 4a as a lens portion is held at one end of the same. The other end of the cover body 4 is secured to the second surface 2b of the circuit board 2, such that it covers the through hole 6 by means of, for example, bonding.

When light impinges upon the lens 4a, the light is guided to the CCD image sensor 11 of the pickup element 3 through the through hole 6 of the circuit board 2. The CCD image sensor 11 performs functions, such as photoelectric conversion, charge storage and charge transfer, to convert the light guided thereto into an electrical signal. An image based on the converted electrical signal is displayed, for example, on a display portion of a video camera.

Figure 12:
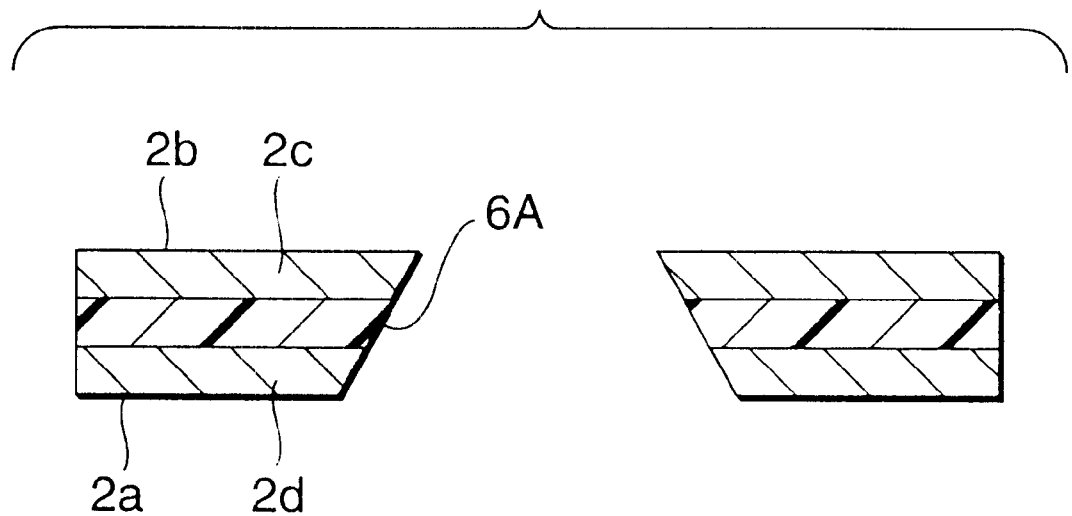
FIG. 12 is a sectional view of a state of the embodiment in which a through hole having a different configuration has been formed.
Figure 13:
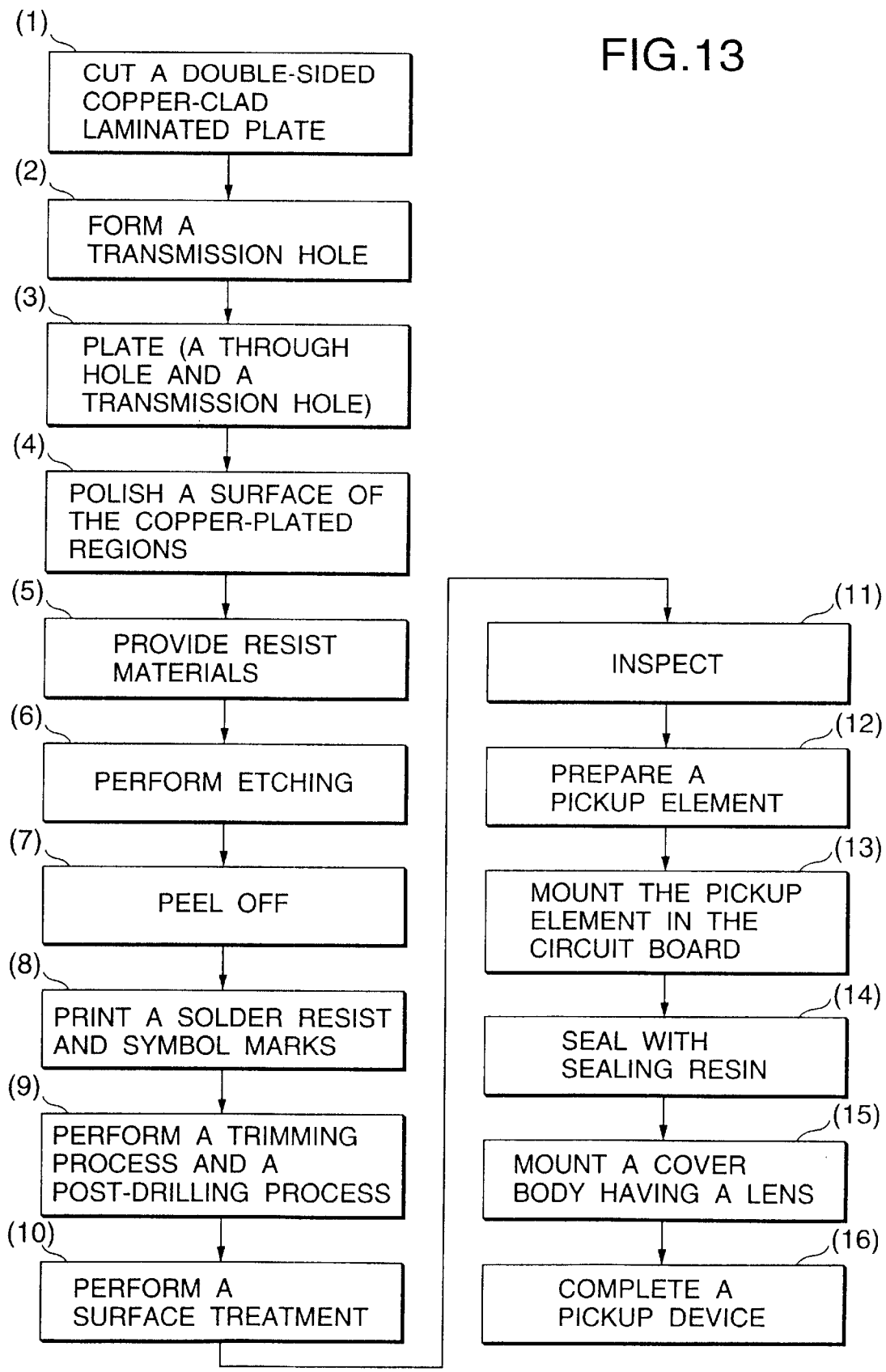
FIG. 13 illustrates an operational procedure for manufacturing the image pickup device of the embodiment.

A description will now be given of a method of manufacturing the image pickup device 1 with reference to the operational procedure shown in FIG. 13 and the illustrations of steps shown in FIGS. 2 through 12.

The manufacturing method described below represents the formation of the circuit board 2 using a subtractive method.

Figure 2:
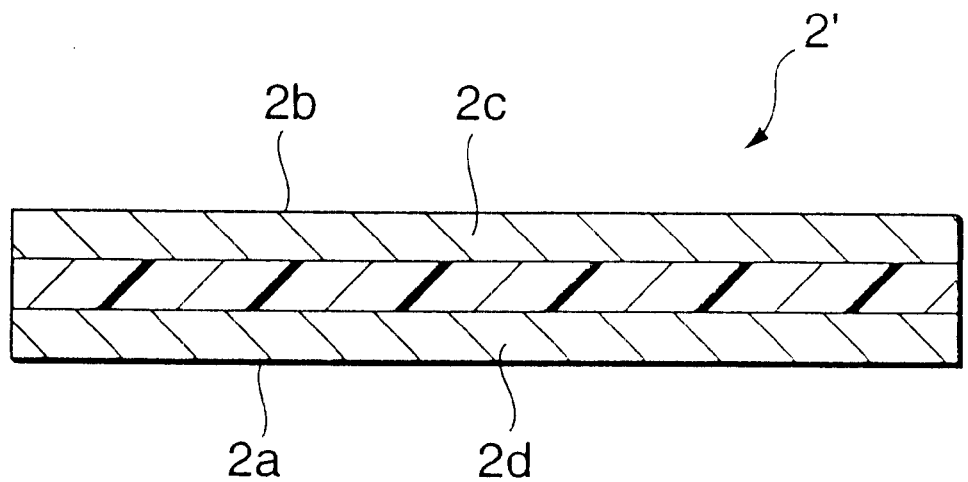
FIG. 2 is a sectional view of aboard (double-sided copper-clad laminated plate) of an embodiment of the invention.

(1) For example, a double-sided copper-clad laminated plate having copper-plated regions 2c and 2d on both sides is provided as a board 2' and is cut into a predetermined configuration (see FIG. 2).

Figure 3:
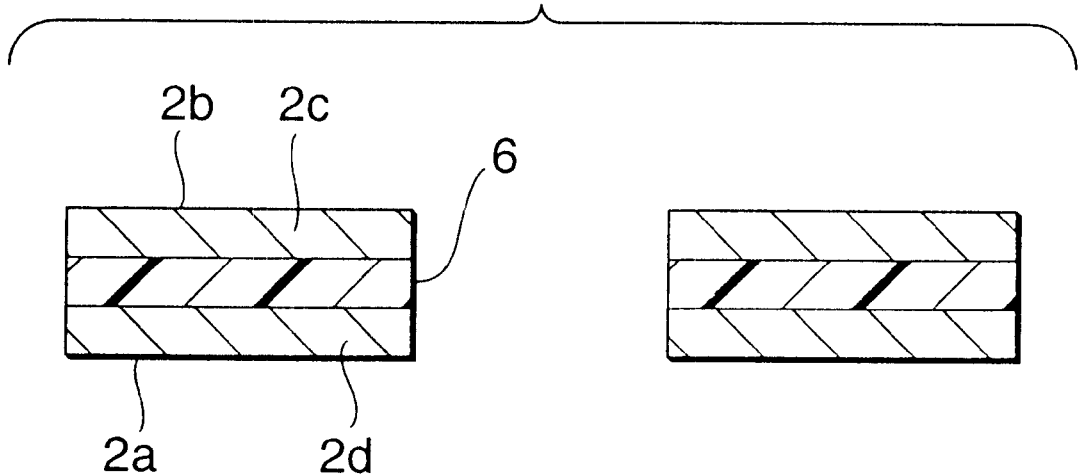
FIG. 3 is a sectional view of a state of the embodiment in which a through hole has been formed.

(2) A through hole 6 is formed in a predetermined position on the board 2' (see FIG. 3). For example, the through hole 6 is preferably formed using an NC drill or rooter; and, the circumferential surface of the through hole 6 thus formed preferably has a roughness which is adequate for plating the same. Any necessary through hole is also formed at this time. The through hole 6 may be formed perpendicularly to the principal surface of the circuit board 2, as shown in FIG. 3. Alternatively, for example, a through hole 6A may be formed whose diameter increases with the closeness to the first surface 2a, as shown in FIG. 12.

Figure 4:
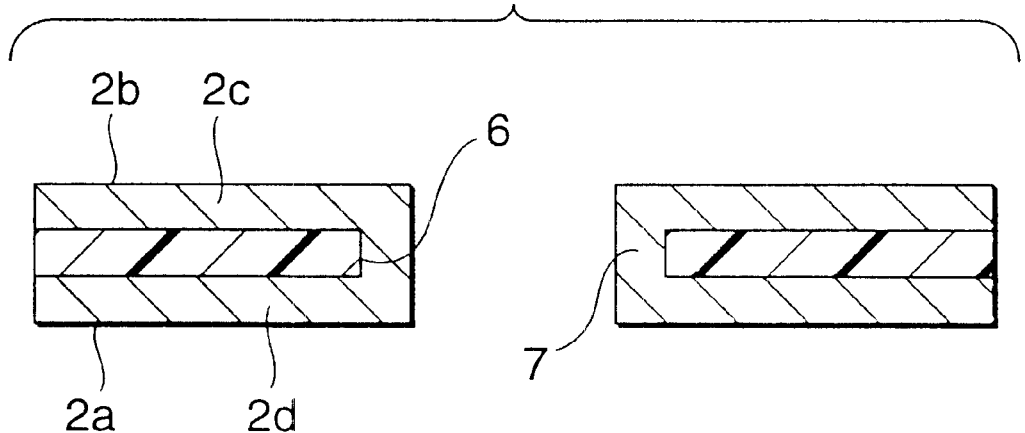
FIG. 4 is a sectional view of a state of the embodiment in which an inner circumferential surface of the through hole has been plated.

(3) A plated region 7 is provided on the circumferential surface of the through hole 6 (see FIG. 4). The plated region 7 is formed such that it is continuous with the copper-plated regions 2c and 2d. At the same time, the through hole formed, as described above, is also plated to allow an electrical connection.

(4) The surface of the copper-plated regions 2c and 2d is polished. This is a pre-process to allow the application of resist materials.

Figure 5:
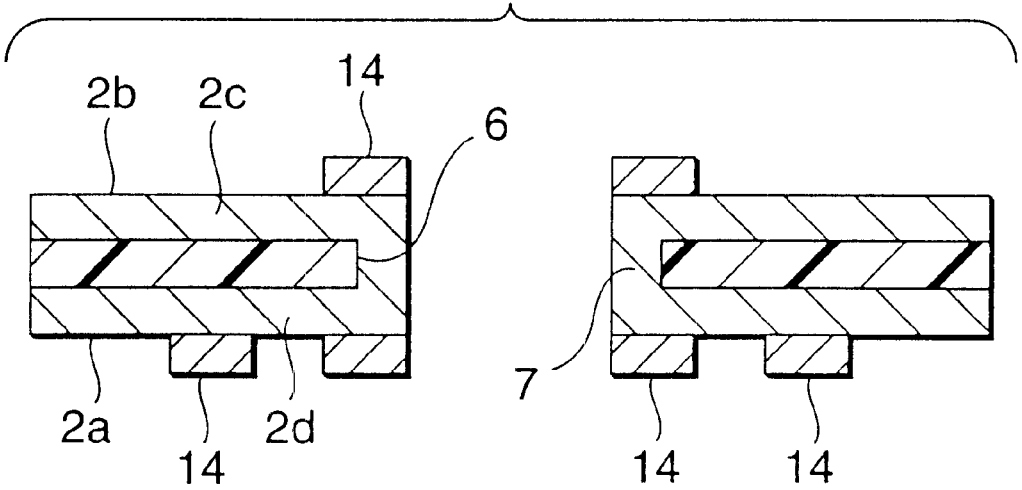
FIG. 5 is a sectional view of a state of the embodiment in which resist materials have been applied thereto.

(5) Resist materials 14, 14, . . . are provided in predetermined positions of the copper-plated regions 2c and 2d where a circuit pattern is formed (see FIG. 5). At this time, the resist materials 14, 14 are provided at parts of the copper-plated regions 2c and 2d located at the edges of the opening of the through hole 6.

Figure 6:
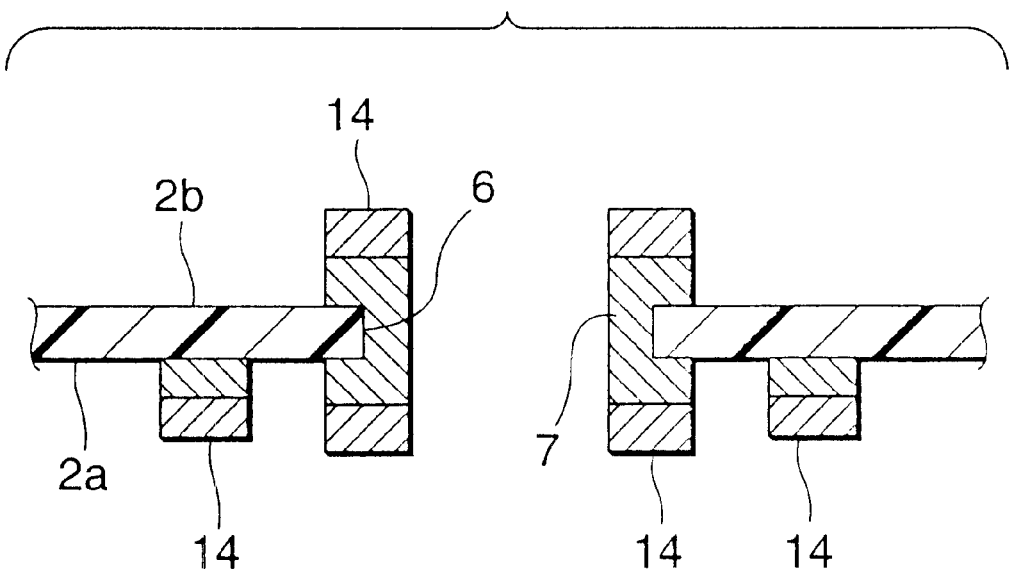
FIG. 6 is a sectional view of a state of the embodiment in which etching has been performed.

(6) Etching is performed to remove the copper-plated regions 2c and 2d which are unnecessary for forming the circuit pattern (see FIG. 6).

Figure 7:
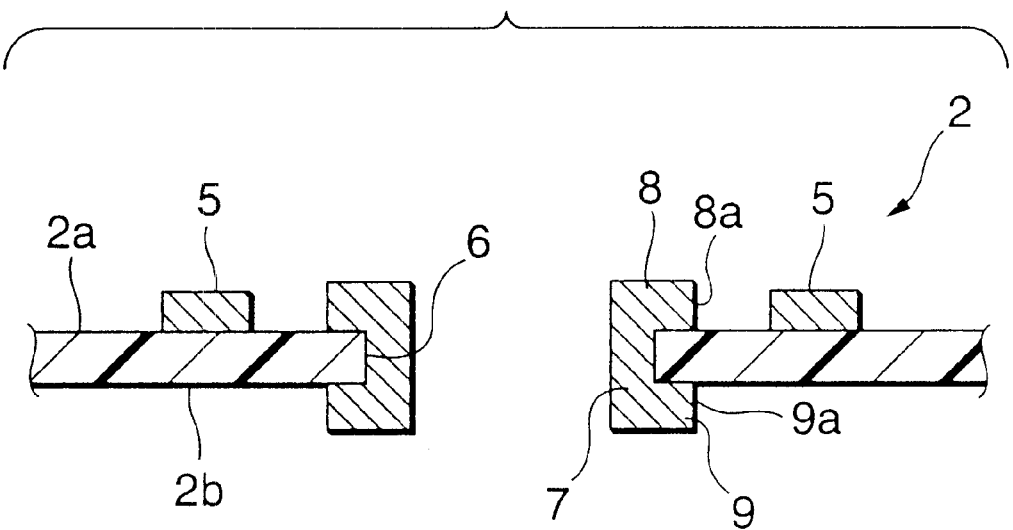
FIG. 7 is a sectional view of a state of the embodiment in which the resist materials have been removed to form a circuit pattern.
Figure 8:
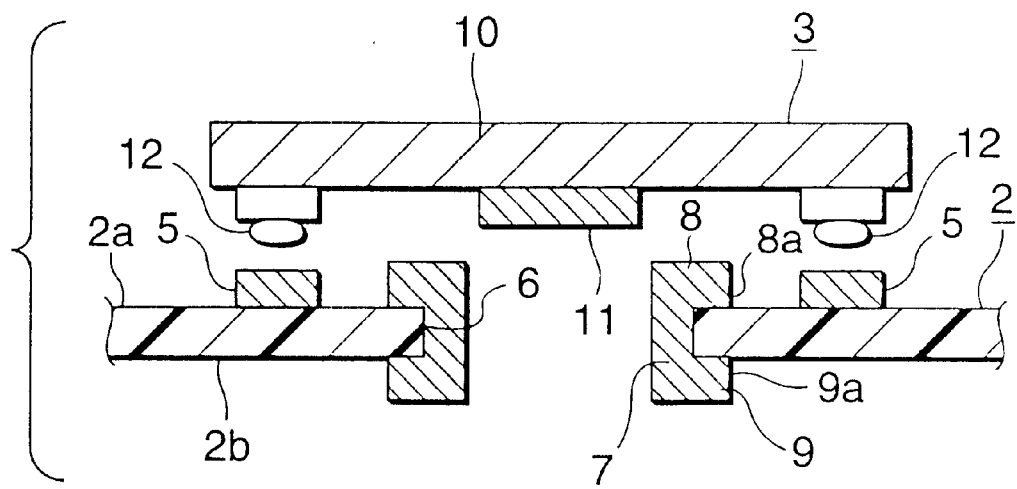
FIG. 8 is a sectional view of a state of the embodiment before an image pickup device is mounted on the circuit board.

(7) The resist materials are peeled off to form the circuit pattern (see FIG. 7). By forming the circuit pattern in such a manner, plated regions 7, 8 and 9 are provided on the circumferential surface of the through hole 6 and both of the upper and lower edges of the opening of the same, and pads 5, 5, . . . are also formed.

(8) A solder resist and symbol marks are then printed.

(9) A trimming process and a post-drilling process are performed.

(10) Surface treatments, such as solder coating, application of preflux and nickel- and gold-plating, are performed to terminate the steps of forming the circuit board 2.

(11) The circuit board 2 thus formed is inspected.

(12) A pickup element 3 is prepared by providing a CCD image sensor 11 and bumps 12, 12, . . . on a base plate 10; the circuit board 2 is disposed such that the pads 5, 5, . . . face upward; and the bumps 12, 12, . . . are located in association with the pads 5, 5, . . . (see FIG. 8).

Figure 9:
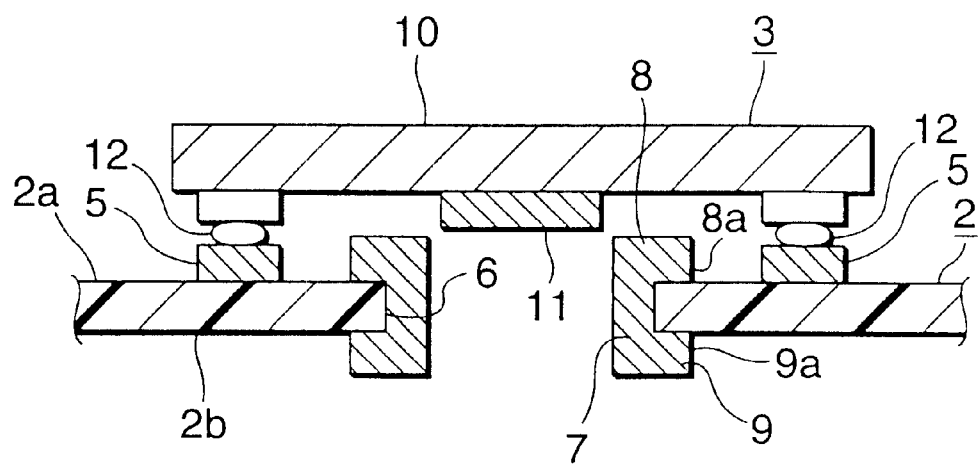
FIG. 9 is a sectional view of a state of the embodiment in which bumps have been bonded to pads to mount an image pickup device on the circuit board.
Figure 10:
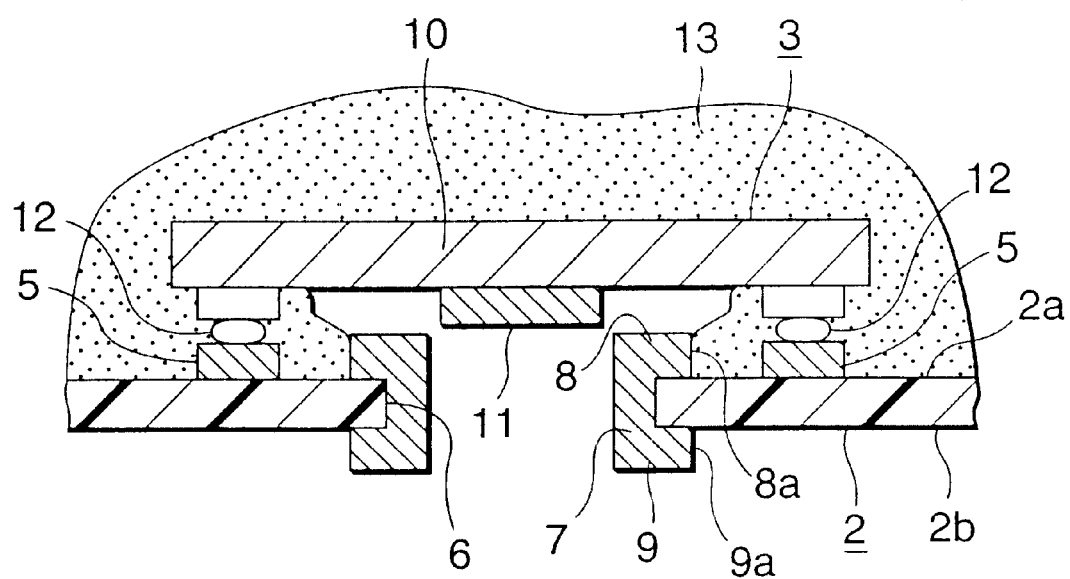
FIG. 10 is a sectional view of a state of the embodiment in which a gap between the circuit body and the pickup element has been sealed with sealing resin.

(13) The pads 5, 5, . . . are bonded to the bumps 12, 12, . . . using, for example, ultrasonic bonding, and the pickup element 3 is mounted in the circuit board 2 from above the same using flip-chip mounting (see FIG. 9). When the pickup element 3 is mounted on the circuit board 2, the CCD image sensor 11 of the pickup element 3 is located in association with the through hole 6. At this time, the flip-chip mounting may be performed using an appropriate process, such as a C4 (controlled collapse chip connection) process, an ACF (anisotropic conductive film) process or a SBB (stad bump bonding) process.

(14) The gap between the circuit board 2 and the pickup element 3 is sealed with sealing resin 13 (see FIG. 9). At this time, the gap between the circuit board 2 and the pickup element 3 is sealed such that the pickup element 3 is completely covered by the sealing resin 13. For example, the sealing resin 13 is thermosetting resin, which tends to flow from the gap between the circuit board 2 and pickup element 3 toward the through hole 6, because it has fluidity unless it is set. An outer circumferential surface 8a of the plated region 8 prevents such an inward flow of the sealing resin 13. Therefore, the plated region 8 serves as a dam for stopping the sealing resin 13, which tends to flow in, to make it possible to prevent the sealing resin 13 from flowing into the through hole 6. The plated region 8 has a necessary thickness, which depends on the viscosity, amount and setting conditions of the sealing resin 13.

Figure 11:
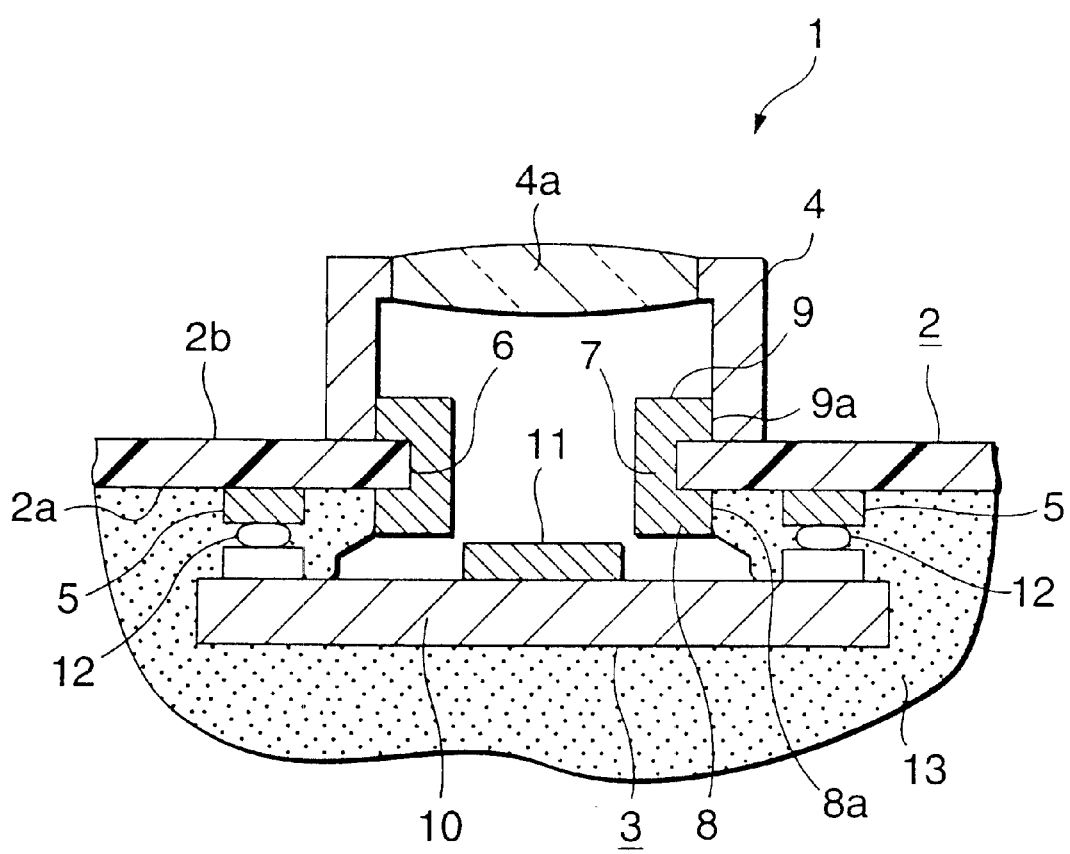
FIG. 11 is a sectional view of a state of the embodiment in which a cover body has been mounted on the circuit board to fabricate the image pickup device.

(15) A cover body 4 having a lens 4a held thereon is mounted on the circuit board 2 (see FIG. 11). The cover body 4 is mounted on the surface of the circuit board 2 opposite to the surface thereof on which the pickup element 3 is mounted by inverting the circuit board 2 such that the pickup element 3 is located under the same. At this time, by forming the plated region 9 with an outer diameter that is equal to the inner diameter of the cover body 4 in advance, the outer circumferential surface 9a of the plated region 9 can be used as positioning means when the cover body 4 is mounted on the circuit board 2. This eliminates the need for providing separate positioning means on the circuit board 2 and makes it possible to mount easily the cover body 4 in a proper position of the circuit board 2. For example, the cover body 4 is secured to the circuit board 2 by means of bonding.

(16) The image pickup device 1 is completed by mounting the pickup element 3 and the cover body 4 on the circuit board 2, as described above.

As described above, the image pickup device 1 has a configuration in which the pickup element 3 and cover body 4 are provided on opposite sides of the circuit board 2, which eliminates the need for providing the molded body f and forming the bonding portion i in the form of a recess to provide the CCD image sensor as a light-receiving portion as in the conventional image pickup device. This makes it possible to provide the image pickup device 1 with a low profile.

Further, since the plated region 7 is provided on the circumferential surface of the through hole 6 of the image pickup device 1, no particle, such as a glass fiber, drops from the circumferential surface of the through hole 6 to stick to the CCD image sensor 11, lens 4, etc., which prevents any reduction of image quality and makes it possible to maintain preferably functionality of the image pickup device 1.

Further, since it is possible to prevent particles from sticking to the CCD image sensor 11, lens 4, etc., a board made of glass epoxy which is, in general, an inexpensive material can be used as the circuit board 2, which makes it possible to reduce the manufacturing cost of the image pickup device 1.

In addition, since the plated regions 7, 8 and 9 can be easily provided at a step for manufacturing the circuit board 2, the provision of the plated regions 7, 8 and 9 does not result in any reduction of manufacturing efficiency.

The above plated regions 7, 8 and 9 are not limited to copper plating, and the plating thickness may be appropriately changed depending on the types of the materials and processes used for the image pickup device 1, the usage of the device, the type of the sealing resin and the like. The plated regions 7, 8 and 9 may be used as electrical connecting portions, e.g., connecting portions for grounding, connecting portions for supplying power and connecting portions for transmission and reception of signals.

While the above-description has referred to the use of a single-layer board as the circuit board, a multi-layer board may be used as the circuit board 2.

Furthermore, when the through hole 6A whose diameter increases with the closeness to the first surface 2a is formed at the above-described manufacturing step (2), it is possible to prevent efficiently stray light from entering the CCD image sensor 11. This effect becomes significant especially when the plated region 7 is formed using a glossy material having high reflective properties.

Any of the specific configurations and structures of each part of the above-described embodiment is merely an example of a specific mode of carrying out the invention and should not be understood as limiting the technical scope of the invention in any sense.

As apparent from the above description, the image pickup device according to the invention is characterized in that it is equipped with a circuit board that is formed with a predetermined circuit pattern having a bonding portion and which has a through hole, a pickup element which has a light-receiving portion and a bonded portion and which is bonded to the bonding portion of the circuit pattern at the bonded portion to be secured to one surface of the circuit board, and a cover body which has a lens portion for guiding incident light to the light-receiving portion of the pickup element through the through hole of the circuit board and that is secured to another surface of the circuit board opposite to the above-mentioned surface such that the through hole is covered.

Since this eliminates the need for providing a molded body and forming a bonding portion in the form of a recess to provide a light-receiving portion as in a conventional image pickup device, it is possible to provide the image pickup device with a low profile.

According to the second aspect of the invention, since plating is performed on the circumferential surface of the through hole of the circuit board, no particle drops from the circumferential surface of the through hole to stick to the light-receiving portion, lens portion, etc. This prevents any reduction of image quality and makes it possible to maintain preferably functionality of the image pickup device.

Further, since it is possible to prevent particles from sticking to the light-receiving portion, lens portion, etc., a board made of glass epoxy which is, in general, an inexpensive material can be used as the circuit board, which makes it possible to reduce the manufacturing cost of the image pickup device.

In addition, since the plating can be easily performed at a step for manufacturing the circuit board, the provision of the plating does not result in any reduction of manufacturing efficiency.

According to the third aspect of the invention, since plating is performed at the edge of the opening of the through hole on the side of the circuit board where the cover body is secured, the plating can be used as a positioning means when the cover body is mounted on the circuit board. This eliminates the need for providing separate positioning means on the circuit board and makes it possible to mount the cover body in a proper position of the circuit board easily.

According to the fourth and fifth aspects of the invention, the gap between the circuit board and the pickup element is sealed with sealing resin; and, plating is performed at the edge of the opening of the through hole on the side of the circuit board where the pickup element is secured. As a result, the plating can be used as a dam for stopping the flow of the sealing resin, which makes it possible to prevent the sealing resin from flowing into the through hole.

The method of manufacturing an image pickup device according to the invention is characterized in that it has the steps of forming a circuit board by forming a predetermined circuit pattern having a bonding portion and a through hole on a board, bonding a bonded portion of a pickup element having a light-receiving portion and the bonded portion to the bonding portion of the circuit board to secure the pickup element on one surface of the circuit board and securing a cover body having a lens portion for guiding incident light to the light-receiving portion of the pickup element through the through hole on another surface of the circuit board opposite to the above-mentioned surface such that the through hole is covered.

Since this eliminates the need for providing a molded body and forming a bonding portion in the form of a recess to provide a light-receiving portion as in a conventional image pickup device, it is possible to provide the image pickup device with a low profile.

What is claimed is:

1. An image pickup device comprising:
   a circuit board which is formed with a predetermined circuit pattern having a bonding portion and which has a through hole;
   a pickup element which has a light-receiving portion and a bonded portion and which is bonded to the bonding portion of the circuit pattern at said bonded portion and secured to one surface of the circuit board; and
   a cover body which has a lens portion for guiding incident light to the light-receiving portion of the pickup element through the through hole of the circuit board and which is secured to another surface of the circuit board opposite to said surface such that the through hole is covered, wherein a circumferential surface of the through hole of said circuit board is plated.

2. An image pickup device according to claim 1, wherein plating is provided at an edge of the opening of the through hole of the circuit board on the side where the cover body is secured.

3. An image pickup device according to claim 1, wherein the gap between the circuit board and pickup element is sealed with sealing resin, and wherein plating is provided at an edge of the opening of the through hole of the circuit board on the side where the pickup element is secured.

4. An image pickup device according to claim 2, wherein the gap between the circuit board and pickup element is sealed with sealing resin, and wherein plating is provided at an edge of the opening of the through hole of the circuit board on the side where the pickup element is secured.

5. A method of manufacturing an image pickup device comprising the steps of:
   forming a circuit board by forming a predetermined circuit pattern having a bonding portion and a through hole on a board;
   plating a circumferential surface of said through hole;
   bonding a bonded portion of a pickup element having a light-receiving portion and the bonded portion to the bonding portion of the circuit board to secure the pickup element on one surface of the circuit board; and
   securing a cover body having a lens portion for guiding incident light to the light-receiving portion of the pickup element through the through hole on another surface of the circuit board opposite to said surface such that the through hole is covered.

6. An image pickup device comprising:
   a double-sided metal-laminated circuit board which is formed with a predetermined circuit pattern having a bonding portion and which has a through hole;
   a pickup element which has a light-receiving portion and a bonded portion which is bonded to the bonding portion of the circuit pattern on one side of the circuit board; and,
   a cover body which has a lens portion for guiding incident light to the light-receiving portion of the pickup element through the through hole of the circuit board and which is secured to the other side of the circuit board opposite to said one side such that the through hole is covered.

7. An image pickup device according to claim 6 wherein the through hole is plated at its edges and at its circumferential surface.

8. A method of manufacturing an image pickup device comprising the steps of:
   providing a double-sided metal-laminated circuit board;
   forming a through hole in a predetermined position of said circuit board;
   forming a plated region on the circumferential surface of the through hole;
   forming resist material, defining a circuit pattern, on said circuit board;
   etching unnecessary metal-laminated material about the circuit pattern;
   peeling off remaining resist material;
   bonding a bonding portion of a pickup element having a light receiving portion and a bonding portion of the circuit board to secure the pickup element on one side of the circuit board; and,
   securing a cover body having a lens portion for guiding incident light to the light receiving portion of the pickup element through the through hole on the other side of the circuit board such that the through hole is covered.

9. The method of manufacturing an image pickup device according to claim 8 wherein after the bonding portion of the pickup device is bonded to the bonding portion of the circuit board a gap formed between the pickup element and the circuit board is sealed with a sealing resin.

10. The method of manufacturing an image pickup device according to claim 9 wherein said sealing resin is thermosetting.

* * * * *